(12) United States Patent  
Neukam

(10) Patent No.: US 9,025,320 B2  
(45) Date of Patent: May 5, 2015

(54) HOUSING FOR COMPUTER SYSTEM AS WELL AS COMPUTER SYSTEM WITH SUCH A HOUSING

(71) Applicant: Fujitsu Technology Solutions Intellectual Property GmbH, München (DE)

(72) Inventor: Wilhelm Neukam, Bobingen (DE)

(73) Assignee: Fujitsu Technology Solutions Intellectual Property GmbH (DE)

( * ) Notice: Subject to any disclaimer, the term of this patent is extended or adjusted under 35 U.S.C. 154(b) by 206 days.

(21) Appl. No.: 13/733,387

(22) Filed: Jan. 3, 2013

(65) Prior Publication Data

US 2013/0171845 A1    Jul. 4, 2013

(30) Foreign Application Priority Data

Jan. 4, 2012    (DE) .......................... 10 2012 100 058

(51) Int. Cl.
| | |
|---|---|
| *H05K 5/00* | (2006.01) |
| *H05K 7/00* | (2006.01) |
| *G06F 1/16* | (2006.01) |
| *G06F 1/18* | (2006.01) |
| *H01R 13/453* | (2006.01) |
| *H01R 103/00* | (2006.01) |
| *H01R 24/66* | (2011.01) |

(52) U.S. Cl.
    CPC .............. *H05K 5/00* (2013.01); *H01R 2103/00* (2013.01); *G06F 1/181* (2013.01); *H01R 13/4534* (2013.01); *H01R 24/66* (2013.01)

(58) Field of Classification Search
    CPC .. G06F 1/181; H01R 13/4534; H01R 13/701; Y10S 439/911
    USPC ............... 361/679.01, 679.34, 679.6, 679.02; 439/135, 136, 137, 140, 142, 143, 145, 439/149
    See application file for complete search history.

(56) References Cited

U.S. PATENT DOCUMENTS

| | | | |
|---|---|---|---|
| 6,038,125 | A | 3/2000 | Anzai |
| 6,549,397 | B1 * | 4/2003 | Diaz et al. ................... 361/679.6 |
| 7,207,812 | B1 * | 4/2007 | Wong ............................ 439/136 |
| 7,264,489 | B2 | 9/2007 | Higham et al. |
| 2011/0304972 | A1 * | 12/2011 | Goh et al. ................ 361/679.33 |
| 2013/0171851 | A1 | 7/2013 | Neukam |

FOREIGN PATENT DOCUMENTS

| | | |
|---|---|---|
| DE | 94 04 326.4 | 6/1994 |
| DE | 298 16 033 U1 | 1/1999 |
| DE | 10 2009 019 517 A1 | 12/2010 |

* cited by examiner

*Primary Examiner* — Anthony Haughton
(74) *Attorney, Agent, or Firm* — DLA Piper LLP (US)

(57) ABSTRACT

A housing for a computer system which can be opened at least on a first housing wall for access into the housing and wherein, on a second housing wall, an opening for an external connector plug is arranged, the housing having a covering fixture to cover the opening for the connector plug, wherein the covering fixture is operable by the first housing wall such that the opening for the external connector plug is covered at least partially when the housing is opened, and the opening for the external connector plug is not covered when the housing is closed.

16 Claims, 2 Drawing Sheets

HOUSING FOR COMPUTER SYSTEM AS WELL AS COMPUTER SYSTEM WITH SUCH A HOUSING

RELATED APPLICATION

This application claims priority of German Patent Application No. 10 2012 100 058.1, filed Jan. 4, 2012, the subject matter of which is incorporated herein by reference.

TECHNICAL FIELD

This disclosure relates to a housing for a computer system, wherein the housing can be opened at least on a first housing wall for access to the housing, and wherein an opening for an external connector plug is arranged on a second housing wall. The disclosure further relates to a computer system with such a housing.

BACKGROUND

Computer systems have electronic components which are current-carrying and/or on which an electrical voltage is present. When a housing of a computer system is opened, there is with improper operation the danger of an electric shock (so-called "power hazard" or danger of an electric accident). An improper operation exists, for example, if the computer system, with opened housing, is connected by an external connector plug to an external current or voltage source. This can occur, for example, by a power supply unit (such as a power adapter) connected to the power supply network (powergrid).

Particularly in computer systems in which the power supply for the conversion of the grid-side alternating current to a supply voltage is arranged within the housing of the computer system, high (input) voltages are applied to electronic components in the housing.

It could therefore be helpful to provide a computer system safer against improper operation so that the power hazard for a user is considerably reduced or prevented.

SUMMARY

I provide a housing for a computer system which can be opened at least on a first housing wall for access into the housing and, wherein, on a second housing wall, an opening for an external connector plug is arranged, the housing having a covering fixture to cover the opening for the connector plug, wherein the covering fixture is operable by the first housing wall such that the opening for the external connector plug is covered at least partially when the housing is open, and the opening for the external connector plug is not covered when the housing is closed.

I also provide a computer system including the housing, wherein, in the housing, at least one system board, and behind the opening on the second housing wall, one power supply connector is arranged for electrical interaction with an external connector plug.

LIST OF REFERENCE NUMERALS

Figure 1:
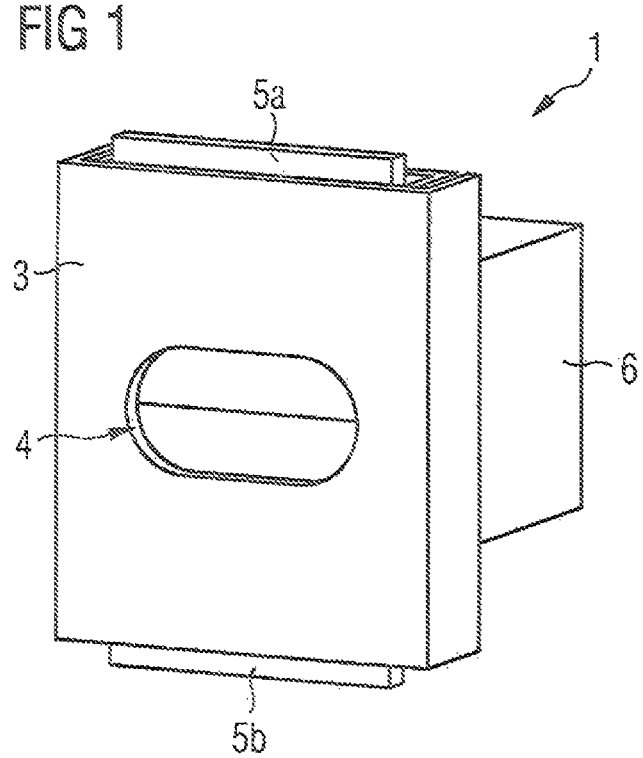
FIG. 1 is a perspective representation of a front view of a portion of a housing.

1 Housing
2a, 2b First housing wall
3 Second housing wall
4 Opening for external connector plugs
5a, 5b Slider
6 Power supply connector
16 Connection contacts

DETAILED DESCRIPTION

It will be appreciated that the following description is intended to refer to specific examples of structure selected for illustration in the drawings and is not intended to define or limit the disclosure, other than in the appended claims.

I provide a housing having a covering fixture for covering the opening for the connector plug, wherein the covering fixture can be operated by the first housing wall such that the opening for the external connector plug is at least partially covered when the housing is open, and the opening for the external connector plug is not covered when the housing is closed.

Such a housing has the advantage that when the housing is open, connection possibilities for external connector plugs are blocked. Then, no external connector plug can be inserted through the opening of the housing and connected to electronic components in the housing. In this manner, it is not possible for electronic components arranged in the housing to connect to the power supply grid by an external connector plug when the housing is open.

The covering fixture is coupled with the first housing wall which can be opened such that the covering fixture covers the opening for the external connector plug on the second housing wall at least partially, or occludes it as soon as the housing on the first housing wall is opened. Thus, an occlusion of connection possibilities on a housing wall can be controlled by opening the housing on another housing wall.

The terms "first" and "second" housing wall describe different housing walls on a housing. This means that the first housing wall extends, for example, over a first surface, wherein the second housing wall extends over a second surface. The two faces are not formed parallel to each other. In the simplest case, the first housing wall can be formed nearly perpendicular to the second housing wall. For example, the first housing wall can be a side wall of a housing and the second housing wall can be a rear wall of a housing.

The housing may prevent improper operation which consists of connecting a computer system accommodated in the housing to the power supply grid, in spite of the housing being open. Thus, a user is prevented from gaining access in the housing interior to electronic components that are current-carrying or to which an electrical voltage is applied. Thus, the risk of an electric shock or an electrical accident due to the above-mentioned housing is considerably reduced or even prevented.

In particular, such a housing can be used advantageously for computer systems in which the power supply unit, i.e., the power adapter, is integrated in the housing. The power supply unit can be integrated permanently in the housing so that it cannot be removed.

The first housing wail may work mechanically together with the covering fixture when the housing is closed, wherein the first housing wall need not work mechanically together with the covering fixture when the housing is open. This means that the covering fixture can keep the opening for the external connector plug open only if it works together with the first housing wall, and covers the opening at least partially when the covering fixture does not work mechanically together with the first housing wall (that is to say when the housing on the first housing wall is open). The covering fixture, when not exposed to the action of the first housing wall, may thus be in a state in which it automatically covers the opening for the external connector plug, wherein the covering fixture can be brought into a state in which the opening for the external connector plug is open only if it works together with the first housing wall so that an external connector plug can be introduced through the opening into the housing.

The covering fixture may comprise at least one slider that can be shifted between a first position and a second position, wherein the slider in the first position may cover the opening at least partially and in the second position need not cover the opening. The at least one slider can be shifted to and fro between the first and the second position. In the process, the slider can carry out a translational or rotary motion or a combination of a translational and a rotary motion.

It is possible for the slider itself to work mechanically together with the first housing wall. Alternatively, it is possible to provide at least one coupling element between the slider and the first housing wall for positive coupling of the first housing wall with the slider.

Furthermore, another mechanism can alternatively be provided to a slider. For example, a flap mechanism with a kind of flap can also be provided, which, in the case of mechanical contact with the first housing opening, is maintained in a position in which the opening for the external connector plug is maintained open and which, in the case of opening of the housing on the first housing wall, is swiveled into a position in which the opening for the external connector Plug is covered at least partially, or occluded, by the flap. The flap can fall downward, for example, due to gravity and cover the opening when the first housing wall is opened.

The design of the covering fixture as a slider can be varied in that the slider is spring mounted by a flexible element. In the ease of relaxation of the flexible element, the slider is in the first position and it can be brought against a force of the flexible element from the first position into the second position. The flexible element can be any type of spring system. The advantage of the coupling of the slider with a flexible element is that the slider is moved automatically into the first position and is held there when the first housing wall is open. It is only when the first housing wall works mechanically together with the covering fixture or directly with the slider that the slider may be brought against the force of the flexible element into the second position and is held there.

As soon as the housing on the first housing wall is open, the slider may be forced by the force of the flexible element from the second position into the first position to cover the opening for the external connector plug. This has the advantage that after opening, no additional operating action needs to be carried out to cover the opening. Furthermore, a spring-mounted mechanism ensures a safe and reliable covering of the opening as soon as the housing is open.

In the ease of alternative designs of a covering fixture, for example, as a flap mechanism as explained above, a flexible element can also be provided to trigger an automatic covering of the opening by the covering fixture when the housing is open on the first housing wall.

In one example of the covering fixture with a slider, the slider in the first position may project beyond the second housing wall and, in the case of contact with the first housing wall, it can be pushed into the second position. In this example, the slider works mechanically together with the first housing wall directly. The slider can be operated by the first housing wall and it is actuated by the first housing wall when the wall is brought into a closed position for closing the housing. Then, the first housing wall pushes against the slider so that the latter is pushed from the first position into the second position and exposes the opening. In the second position, the opening is then maintained open for the external connector plug.

Advantageously, a computer system is configured with a housing of the described type, wherein in the housing, at least one system board of the computer system as well as behind the opening on the second housing wall of the housing, one power supply connection for working electrically together with an external connector plug is arranged. To supply the computer system with electrical energy, an external connector plug can be connected through the opening of the housing to the power supply connection in the housing so that electrical energy can be supplied to the computer system from outside.

The computer system may comprise a power supply unit arranged in the housing of the computer system, for example on the system board. The power supply unit can be mounted fixedly in the housing of the computer system so that the power supply unit is not removable. Electrical A. C. voltage of the power supply grid, e.g., 230 VAC, is supplied to the computer system from outside. It is precisely in the last-mentioned case that it is advantageous to prevent a connection of the computer system to the power supply grid and thus an application of AC voltage to electronic components in the housing of the computer system, by covering the opening for the external connector plug on the housing in the above explained manner when the housing of the computer system is open on the first housing wall. Thus, the risk of an electrical shock for operating or service personnel of the computer system is considerably reduced.

The computer system may be a Thin Client, an All-in-One-PC or a mini PC.

Additional advantages are disclosed in the Drawings as well as in the following description of the Drawings.

FIG. 1 shows a perspective representation of a portion of a housing wall 3 which forms a portion of a housing 1 for a computer system. The housing wall 3 is, for example, a rear or side wall of a housing 1 for a computer system and it has an opening 4 for one or more connector plugs, wherein the connector plug(s) during operation of a computer system can be led through the opening 4. The representation in FIG. 1 shows behind the opening 4 in the interior of the housing 1 a diagrammed power supply connector 6 for the connection of a computer system to the power supply grid.

However, in the state represented in FIG. 1, the opening 4 is occluded by two sliders 5a and 5b and completely closed. Thus, according to FIG. 1, an introduction of an external connector plug through the opening 4 into the housing 1 is prevented.

FIG. 1 shows a state of the housing 1 in which the housing 1 is open on two additional housing walls (not shown). This can occur, for example, for maintenance purposes. As soon as the housing 1 is open in such a manner, the sliders 5a and 5b move into the positions represented in FIG. 1.

The sliders 5a and 5b can be operated by additional housing walls of the housing 1, as explained below.

Figure 2:
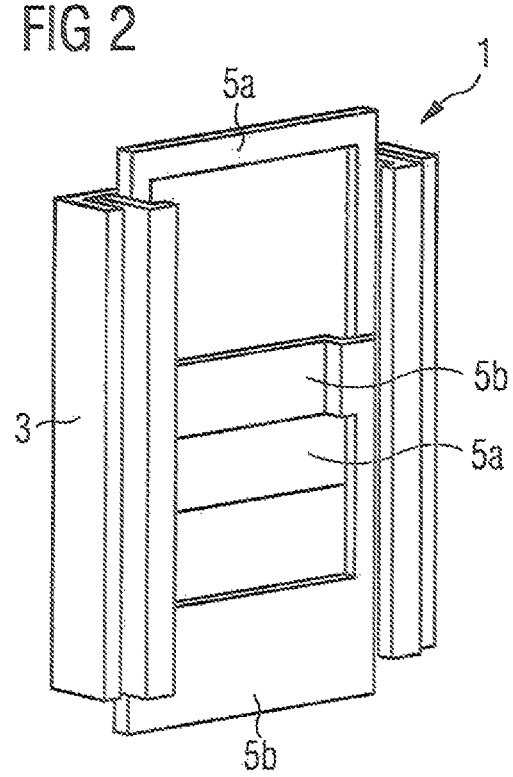
FIG. 2 is a perspective representation of a rear view of a portion of the housing according to FIG. 1.

FIG. 2 shows a perspective representation of the portion of the housing wail 3 of the housing 1 according to FIG. 1, in particular, in FIG. 2, the design of the two sliders 5a and 5b is shown. The sliders 5a and 5b are designed such that they can be shifted in a predetermined direction. Thereby, the sliders 5a and 5b are then each restraint guided in a guide. The guide can be a portion of the housing wall 3 or one or more separate portions.

The sliders 5a and 5b together form a link, wherein the slider 5a comprises a lower portion of a covering (see FIG. 1) and the slider 5b comprises an upper portion of the covering. If the slider 5a is moved from the first position represented in FIG. 2 downward, then the lower portion of the covering, which is formed by the slider 5a, also moves downward.

The same applies to the slider 5b. If the slider 5b is moved from the position represented in FIG. 2 upward, then the upper portion of the covering formed by the slider 5b, moves upward. The sliders 5a and 5b engage into one another such that the opening 4 (see FIG. 1) can be opened completely when the two sliders 5a and 5b are pushed together by translation from the position represented in FIG. 2.

The sliders 5a and 5b can each be spring mounted by one or more spring elements (not shown). The spring system is installed advantageously such that the sliders 5a and 5b, without mechanical action from outside, are in the position depicted in FIG. 2, and can be pushed together only against a spring force.

According to FIGS. 1 and 2, the sliders 5a and 5b are arranged link-like such that on the housing wall 3 they project in the opposite direction beyond the housing wall 3. In this manner, the sliders 5a and 5b can be actuated by additional housing walls, as explained below.

Figure 3:
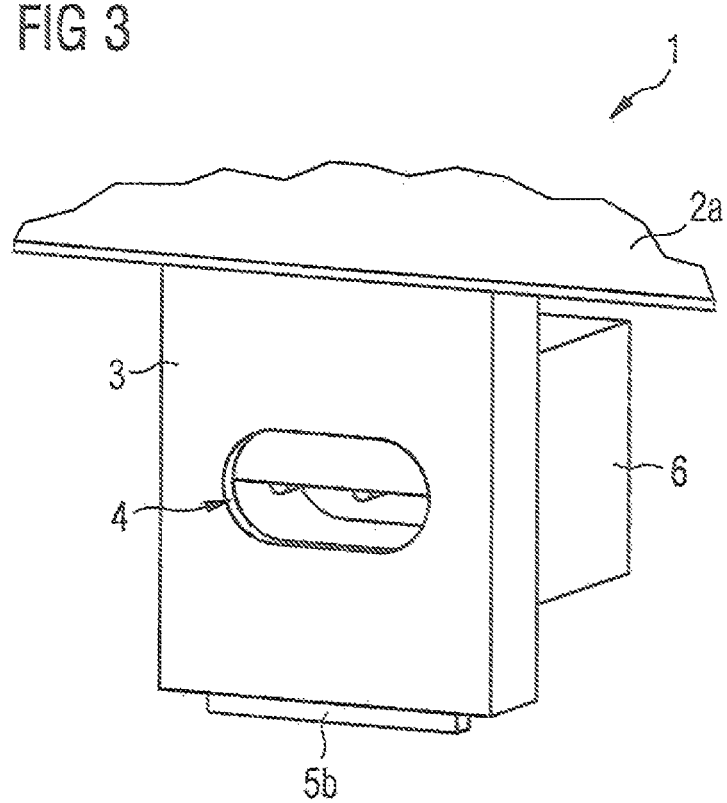
FIG. 3 is a perspective representation of the housing according to FIG. 1 with an additional mounted housing wall.

FIG. 3 shows the housing wail 3 according to FIG. 1, wherein a portion of an additional housing wall 2a rests against the housing wall 3. The housing wall 2a forms, for example, a kind of cover or covering to close off the housing 1 in the upward direction. The housing wall 2a can form, for example, an upper cover sheet of the housing 1.

The housing wall 2a rests against the housing wall 3 and it works mechanically together with the upper slider 5a (see FIG. 2) so that the slider 5a is shifted downward from the position shown in FIG. 2. As a result, the portion of the cover of the opening 4 that is associated with the slider 5a is also moved downward link-like so that the opening 4 in the lower partial area is opened.

The second slider 5b is, however, unchanged in the position according to FIG. 2 so that the opening 4 remains at least partially covered or remains occluded by the slider 5b. An introduction of an external connector plug through the opening 4 into the interior of the housing 1, for example, for the contacting with a power supply connector 6, is still not possible according to FIG. 3. A situation according to FIG. 3 exists, for example, if the housing 1 is indeed closed on an upper side with a housing wall 2a, but the lower side of the housing 1 is still open.

Figure 4:
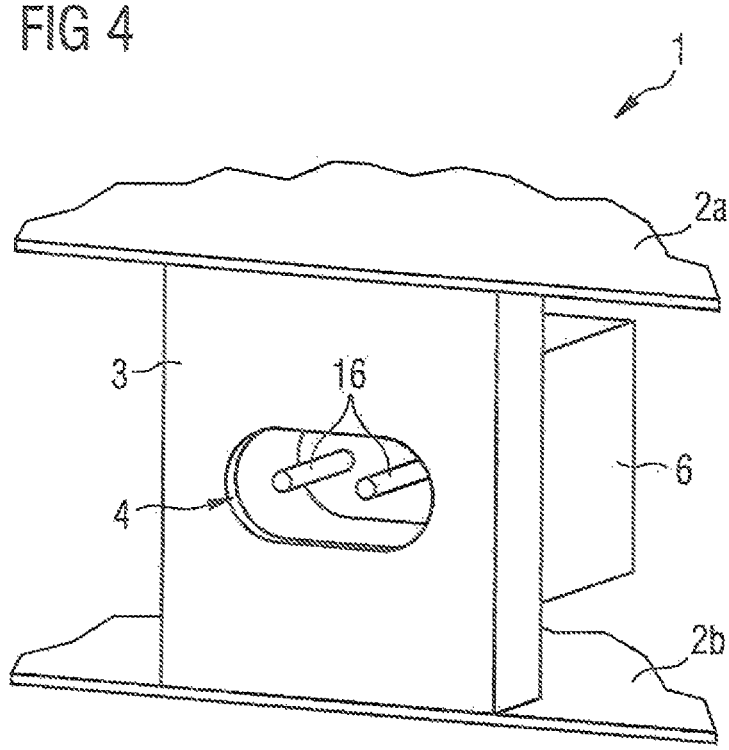
FIG. 4 is a perspective representation of the housing according to FIG. 3 with an additional mounted housing wall.

FIG. 4 shows the housing wall 3 of the housing 1, wherein, besides the housing wall 2a on the upper side of the housing 1, a portion of an additional housing wall 2b is also arranged on the lower side of the housing 1. As in the case of the housing will 2a, the housing wall 2b also rests against the housing wall 3. In this manner, the housing wall 2b works together with the lower slider 5b (see FIGS. 2 and 3) so that the slider 5b has been shifted upward from the position represented in FIGS. 2 and 3. As a result, the portion of the covering of the opening 4 associated with the lower slider 5b is shifted upward link-like so that according to FIG. 4, the opening 4 is now completely opened. In this manner, connection contacts 16 of a power supply connector 6 arranged within the housing 1 and used, for example, for connection of a computer system to a power supply grid, are accessible.

A situation according to FIG. 4 exists, for example, if the housing 1 is completely closed by housing walls 2a and 2b. In this case, and only in this case, can an external connector plug be introduced through the opening 4 into the housing 1, and contacted with connection contacts 16 of the power supply connector 6.

In the explained manner, an external connection of a computer system in the housing 1 with the power supply grid is prevented when one or more housing walls 2a and 2b of the housing 1 have been removed so that the housing 1 is open. In this manner, the risk of an electrical shock and thus the danger for operating personnel is considerably reduced.

A housing 1 can also have only one slider. The latter can then extend over the entire cross section of an opening 4 and cover the opening 4 when a housing wall associated with the slider is open. Furthermore, two sliders can cover the opening 4 in each case completely, wherein the covering areas of the sliders are arranged perpendicularly to the cross section of the opening 4 one after the other. Then, the opening 4 are occluded when at least one housing wall is open, and opened only when the housing. I is completely closed.

It is also possible to cover several openings 4 on a housing wall 3 by a covering fixture using one or more sliders. For example, it is possible to cover an entire I/O slot on a rear wall of a computer system for connecting various plug connections by an explained covering fixture when the housing 1 is open.

Furthermore, it is conceivable to provide, besides the represented sliders 5a and 5b shown, other mechanisms, for example, a flap mechanism that is actuated when one or more housing walls 2a or 2b are removed from the housing 1. forms thereof, it will be appreciated that a wide variety of equivalents may be substituted for the specified elements described herein without departing from the spirit and scope of this disclosure as described in the appended claims.

The invention claimed is:

1. A housing for a computer system which can be opened at least on a first housing wall for access into the housing and wherein, on a second housing wall, an opening for an external connector plug is arranged,
    the housing having a covering fixture to cover the opening for the external connector plug, wherein the first housing wall works mechanically together with the covering fixture when the housing is closed, the first housing wall does not work mechanically together with the covering fixture when the housing is open, and the covering fixture is operable by the first housing wall such that the covering fixture automatically covers the opening for the external connector plug at least partially as soon as the housing is opened and keeps the opening for the external connector plug open only when the housing is closed on the first housing wall such that the opening for the external connector plug is not covered when the housing is closed.

2. The housing according to claim 1, wherein the covering fixture comprises at least one slider shiftable between a first position and a second position, wherein the slider in the first position covers the opening at least partially and in the second position does not cover the opening.

3. The housing according to claim 2, wherein the slider is spring mounted by a flexible element, and the slider is in the first position when the flexible element is relaxed and can be brought against a force of the flexible element from the first position into the second position.

4. The housing according to claim 2, wherein the slider in the first position projects beyond the second housing wall and in case of contact with the first housing wall can be moved into the second position.

5. The housing according to claim 1, wherein, to open the housing, the first housing wall is swivel-mounted with respect to the housing and can be completely removed from the housing.

6. A computer system comprising a housing according to claim 1, wherein, in the housing, at least one system board, and behind the opening on the second housing wall, one power supply connector is arranged for electrical interaction with the external connector plug.

7. The computer system according to claim 6, wherein the power supply connector cannot be connected to the external connector plug when the opening for the external connector plug is covered at least partially by the covering fixture.

8. The computer system according to claim 6, wherein the computer is a Thin Client, All-in-One-PC or Mini PC.

9. The computer system according to claim 7, wherein the computer is a Thin Client, All-in-One-PC or Mini PC.

10. The housing according to claim 1, wherein the covering fixture comprises at least one slider shiftable between a first position and a second position, wherein the slider in the first position covers the opening at least partially and in the second position does not cover the opening.

11. The housing according to claim 10, wherein the slider is spring mounted by a flexible element, and the slider is in the first position when the flexible element is relaxed and can be brought against a force of the flexible element from the first position into the second position.

12. The housing according to claim 3, wherein the slider in the first position projects beyond the second housing wall and wherein contact with the first housing wall can be moved into the second position.

13. The housing according to claim 1, wherein, to open the housing, the first housing wall is swivel-mounted with respect to the housing and can be completely removed from the housing.

14. The housing according to claim 2, wherein, to open the housing, the first housing wall is swivel-mounted with respect to the housing and can be completely removed from the housing.

15. The housing according to claim 3, wherein, to open the housing, the first housing wall is swivel-mounted with respect to the housing and can be completely removed from the housing.

16. The housing according to claim 4, wherein, to open the housing, the first housing wall is swivel-mounted with respect to the housing and can be completely removed from the housing.

* * * * *